(12) United States Patent
Hsu et al.

(10) Patent No.: US 7,557,677 B1
(45) Date of Patent: Jul. 7, 2009

(54) CASCADED MONOLITHIC CRYSTAL FILTER WITH HIGH OUT-OF-BAND REJECTION

(75) Inventors: Tsung-Yuan Hsu, Westlake Village, CA (US); Randall L. Kubena, Oak Park, CA (US)

(73) Assignee: HRL Laboratories, LLC, Malibu, CA (US)

( * ) Notice: Subject to any disclaimer, the term of this patent is extended or adjusted under 35 U.S.C. 154(b) by 186 days.

(21) Appl. No.: 11/643,741

(22) Filed: Dec. 20, 2006

(51) Int. Cl.
*H03H 9/13* (2006.01)
*H03H 9/205* (2006.01)
*H03H 9/56* (2006.01)
*H03H 3/02* (2006.01)

(52) U.S. Cl. .................. 333/189; 333/191; 310/326; 310/365

(58) Field of Classification Search ............... 333/189, 333/191; 310/326, 365
See application file for complete search history.

(56) References Cited

U.S. PATENT DOCUMENTS

| | | | | |
|---|---|---|---|---|
| 4,894,577 A | * | 1/1990 | Okamoto et al. ............ | 310/320 |
| 5,578,974 A | * | 11/1996 | Yang et al. ................... | 333/187 |
| 5,903,087 A | * | 5/1999 | Mattson et al. .............. | 310/365 |
| 6,215,375 B1 | * | 4/2001 | Larson et al. ................ | 333/187 |
| 6,583,689 B2 | * | 6/2003 | Katohno ...................... | 333/191 |
| 6,812,619 B1 | * | 11/2004 | Kaitila et al. ................ | 310/320 |

FOREIGN PATENT DOCUMENTS

JP    2005-252746    *    9/2005

OTHER PUBLICATIONS

Y. Okamoto et al.; "New Monolithic Crystal Filter With Wide Tabs", Proceedings of the 1988 42nd Annual Frequency Control Symposium; Baltimore, MD, Jun. 1-3, 1988, pp. 95-100.*
Ishii, Morita, Saito, and Nakazawa, High Frequency Fundamental Resonators and Filters fabricated by Batch Process using Chemical Etching, IEEE International Frequency Control Symposium, 1995, pp. 818-826.

* cited by examiner

*Primary Examiner*—Barbara Summons
(74) *Attorney, Agent, or Firm*—Christopher R. Balzan, Esq.

(57) ABSTRACT

In one embodiment, a cascaded monolithic crystal filter is provided. A first filter includes two resonators having a pair of electrodes with the monolithic crystal between. At least one electrode has a periphery which includes a feature capable of shifting a frequency associated with an anharmonic mode in the filter. The filter has a second resonator acoustically coupled to the first resonator. A second filter is cascaded with the first filter. The second filter includes a pair of acoustically coupled resonators.

18 Claims, 5 Drawing Sheets

CASCADED MONOLITHIC CRYSTAL FILTER WITH HIGH OUT-OF-BAND REJECTION

BACKGROUND

MCF (monolithic crystal filter) based on quartz technology operating in the fundamental shear mode have been used over the past half century for radio communication applications. The center frequency of these filter are limited to about 10-250 MHz, due to the fabrication difficulty. In the last decade, the rapid progress in the wireless communication has created a strong demand for high performance Gigahertz filters with small dimension and low power consumption.

Currently, the commercially available monolithic crystal filters are usually limited to center frequency of about 250 MHz due to the fabrication difficulties. These relatively low frequency filters showed a rather high insertion loss of 6-7 dB when good out-of-band rejection of about 60 dB is required. At high frequency, the difference in the strength of the first two undesirable anharmonic modes observed in a resonator are usually less than 10 dB from the desirable fundamental shear mode. The suppression of these anharmonic modes has become a critical issue for a high performance Giga Hertz MCF.

To extend the existing MCF technology into the GHz range is not trivial. For a low frequency MCF, a good out-of-band rejection may be achieved by designing a quartz filter supporting only fundamental shear mode. However, at high frequency, greater than 1 GHz, a single mode quartz filter will have the dimension of smaller than a few microns by a few microns, and a gap of 1 micron or less. The tolerance for the fabrication error for such a filter may be costly and difficult to attain with conventional processing. Therefore, a highly effective technique for suppression of anharmonic modes is necessary.

Thus, what is needed is a high performance Giga hertz MCF capable of effectively suppressing anharmonic modes.

SUMMARY

In one embodiment, a cascaded monolithic crystal filter is provided. A first filter includes two resonators having a pair of electrodes with the monolithic crystal between. At least one electrode has a periphery which includes a feature capable of shifting a frequency associated with an anharmonic mode in the filter. The filter has a second resonator acoustically coupled to the first resonator. A second filter is cascaded with the first filter. The second filter includes a pair of acoustically coupled resonators.

BRIEF DESCRIPTION OF THE DRAWINGS

The features and advantages of the present invention will be better understood with regard to the following description, appended claims, and accompanying drawings where:

DESCRIPTION

Figure 1:
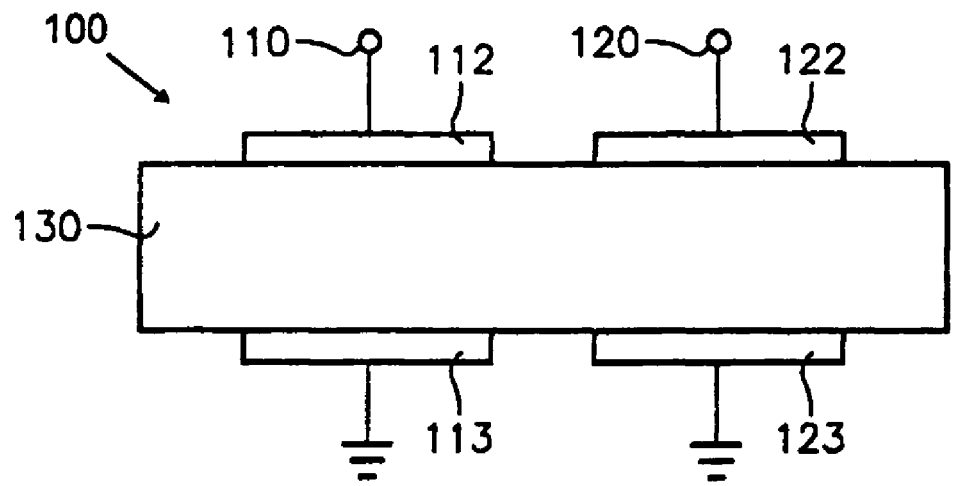
FIG. 1 is a side view of a simplified illustration of one example of a typical 2-pole monolithic crystal filter.

FIG. 1 is a side view of a simplified illustration of one example of a typical 2-pole MCF or monolithic crystal filter 100. The electrodes 112 and 122 are separated from electrodes 113 and 123, respectively, by a piezoelectric material 130, typically quartz. An input voltage signal at 110 is coupled to the output 120 by acoustical coupling through the piezoelectric material 130.

Figure 2:
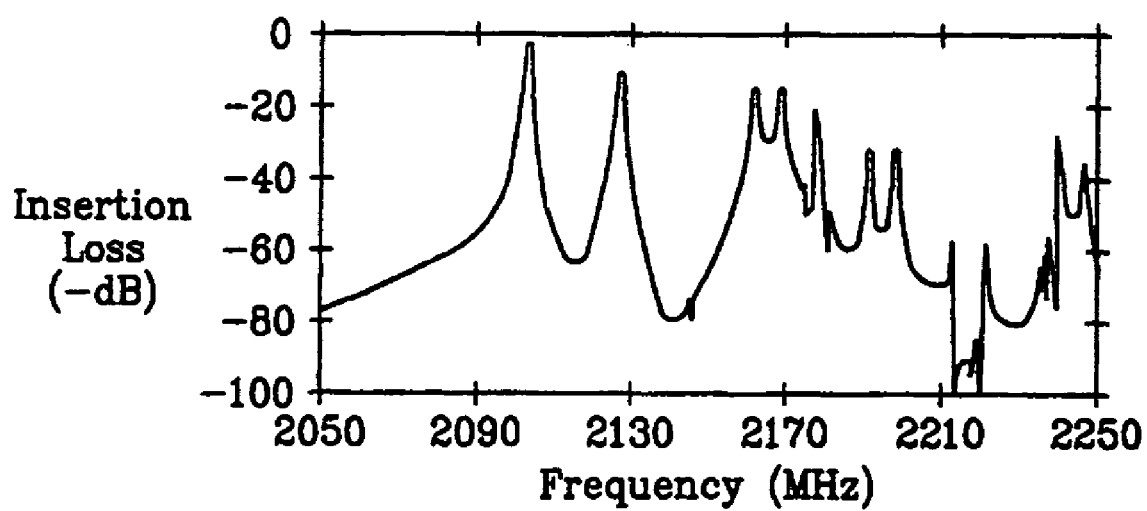
FIG. 2 shows a plot illustrating the spectral response of a typical 2-GHz 2-pole MCF with dimensions of about 15 microns by 19 microns.

FIG. 2 shows a plot illustrating the spectral response 200 of a typical 2-GHz 2-pole MCF with electrodes separated by 1.5 microns and having dimensions of approximately 15 microns by 19 microns. The out-of-band rejection for this filter is very poor due to the existence of several strong undesirable anharmonic modes, especially (1, 1, 3) and (1, 3, 1), in addition to a desirable fundamental shear mode (1, 1, 1). A simple cascade of MCF of the same kind will not significantly improve the out-of-band rejection. An effective way of suppressing anharmonic modes, while keeping the insertion loss of the filter low, is to cascade two or more filters with the same fundamental frequency but significantly different in the anharmonic modes. To achieve this, the differences in the characteristics of acoustic energy trapping of the fundamental and anharmonic modes is exploited as discussed below.

Figure 3A:
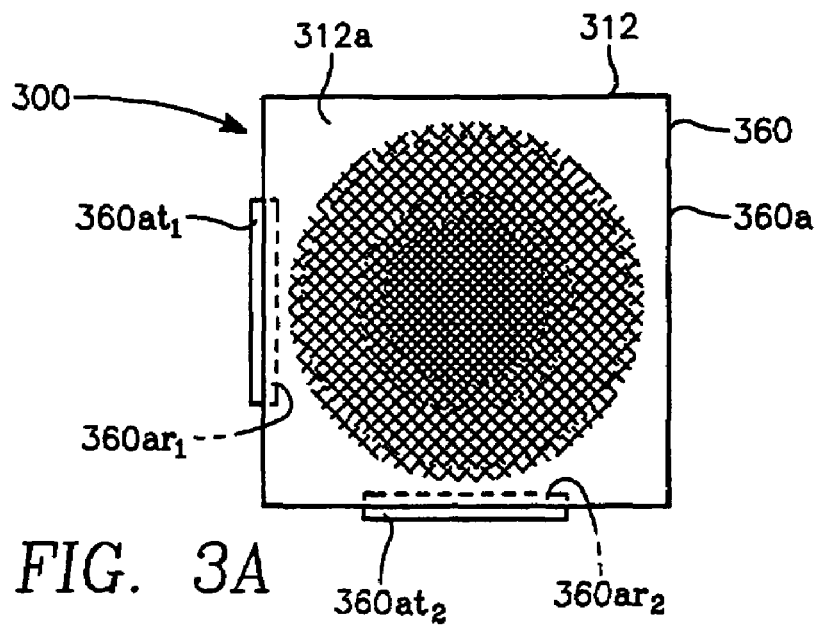
FIG. 3A is a top view illustrating the acoustic energy of the fundamental mode (1,1,1) for a resonator.
Figure 3B:
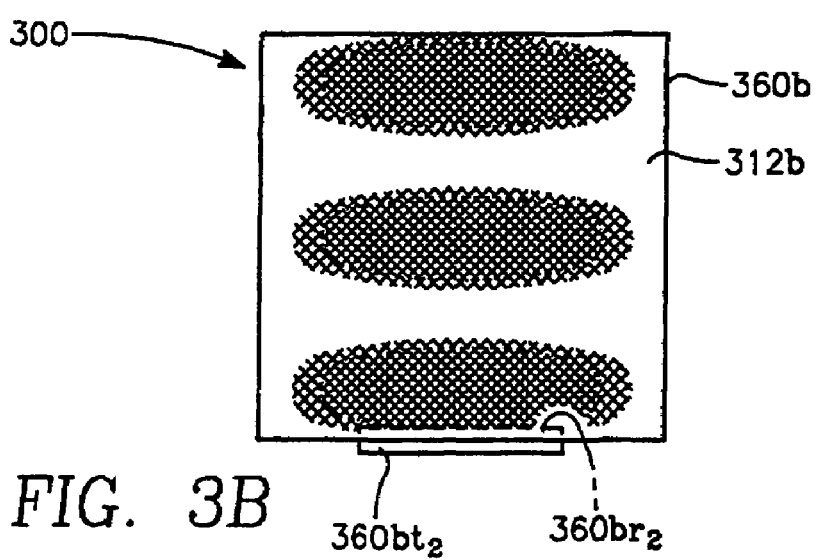
FIG. 3B is a top view illustrating the acoustic energy of the anharmonic mode (1,1,3) for a resonator.
Figure 3C:
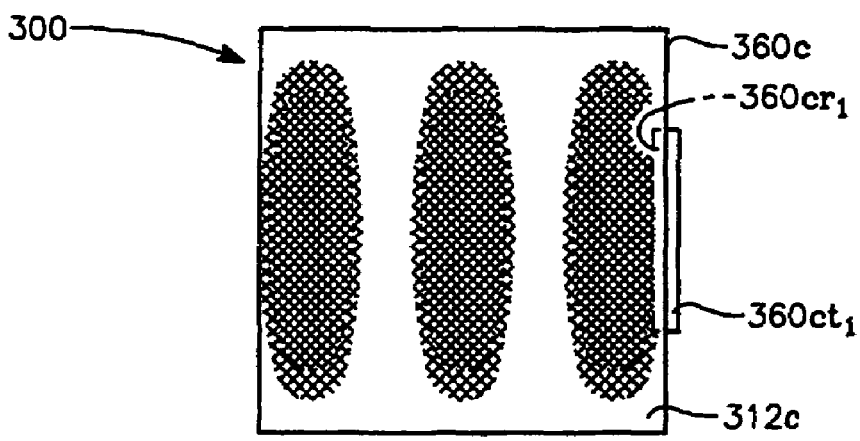
FIG. 3C is a top view illustrating the acoustic energy of the anharmonic mode (1,3,1) for a resonator.

FIGS. 3A-C are top views illustrating the acoustic energy trappings of the fundamental mode (1,1,1), shown in FIG. 3A, and anharmonic modes (1,1,3) and (1,3,1), shown in FIGS. 3B and 3C respectively, for a resonator 300. FIGS. 3A-C illustrate how features, such as tabs $360at_1$ and/or $360at_2$ (FIG. 3A), and/or cut-out portions $360ar_1$ and/or $360ar_2$ (FIG. 3A), formed along the periphery 360 of the electrode 312 affect the fundamental mode (1,1,1) shown in FIG. 3A, differently from the anharmonic modes (1,1,3) and (1,3,1) shown in FIGS. 3B and 3C.

The (1, 1, 1) mode, shown in FIG. 3A, has acoustic energy confined in the center of the electrode 312a. As such, the fundamental mode (1,1,1) is insensitive to the perturbation of the periphery 360a of the electrode 312a. As a result, adding a small electrode tab $360at_1$ and/or $360at_2$, or removing a small portions $360ar_1$ and/or $360ar_2$ of electrode 312a, by laser trimming or FIB for example, will have essentially no effect on the fundamental mode (1, 1, 1) shown in FIG. 3A.

The anharmonic modes (1,1,3) and (1,3,1), however, have acoustic energy spreading toward the peripheries 360b and 360c of the electrodes 312b and 312c, respectively. As such, the anharmonic modes (1,1,3) and (1,3,1) are very sensitive to perturbation of the electrode periphery 360b and 360c, respectively. Adding tabs $360bt_2$ and $360ct_1$, or removing a small portions $360br_2$ and $360cr_1$ of the electrode 360b and 360c has a significant effect on the resonance frequency of respective anharmonic modes. For modes (1,1,3), (1,1,5), etc., adding the tab $360bt_2$ will shift the (1,1,3) (1,1,5) mode toward a lower frequency than an unperturbed electrode. For modes (1,1,3), (1,1,5), etc., removing a portion $360br_2$ will shift the (1,1,3) (1,1,5) toward a higher frequency than unperturbed electrode. Such a modification to electrode, however, will have negligible effect on the (1, 1, 1) and (1, 3, 1) modes. Similarly, adding tab $360ct_1$, or removing portion $360cr_1$ has the significant effect on modes (1,3,1), (1,5,1), etc., but not on modes (1, 1, 1) and (1, 1, 3).

Figure 4:
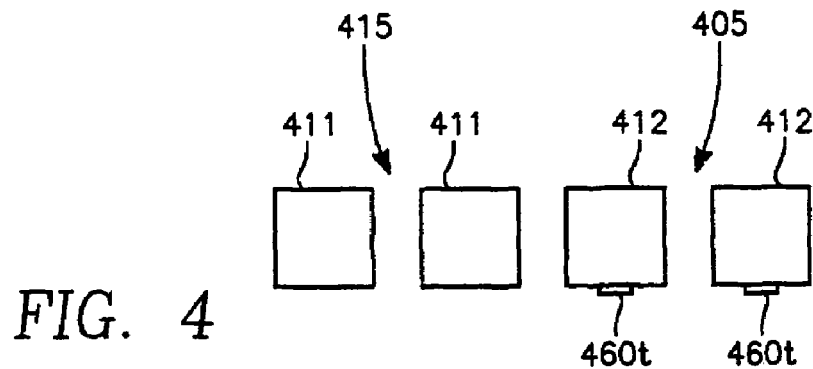
FIG. 4 is a top view showing a simplified illustration of monolithic crystal filters with and without electrode tabs.
Figure 5:
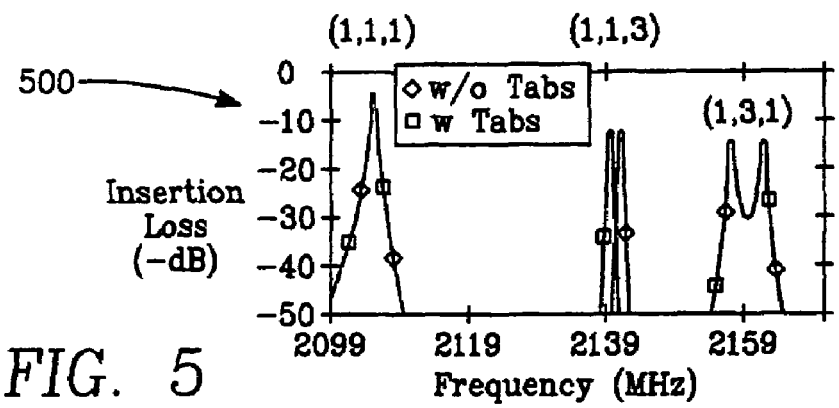
FIG. 5 is a plot of the spectral responses of monolithic crystal filter of FIG. 4 with tabs and without tabs.

FIG. 4 is a top view showing a simplified illustration of electrodes 411 and 412 of monolithic crystal filters 405 and 415. Shown in FIG. 5 is a plot of the spectral response of filter 405 (pair of acoustically coupled resonators) with electrode tabs 460t along with a plot of filter 415 (pair of acoustically coupled resonators) without tabs, shown in FIG. 4. In the specific example embodiment of FIG. 4 the electrodes 412 are separated by 2 microns and are each 16 microns by 16 microns with tabs 460t that extend 1.6 microns from the periphery of the electrode 412 and are each 4 microns wide. The electrodes 411 are similarly sized and spaced, but without tabs.

Figure 6:
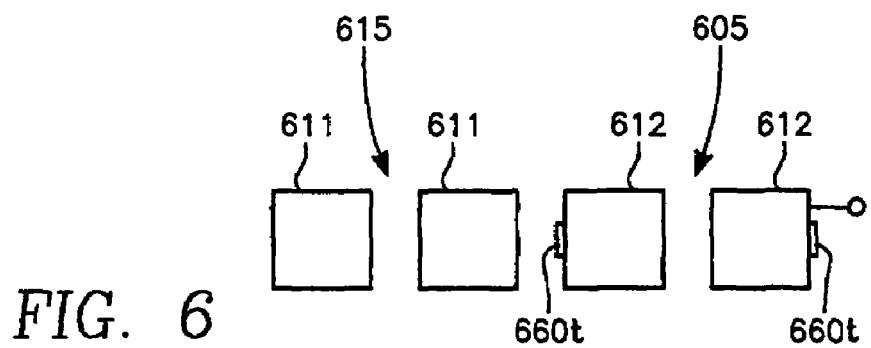
FIG. 6 is a top view showing a simplified illustration of monolithic crystal filters with and without electrode tabs.
Figure 7:
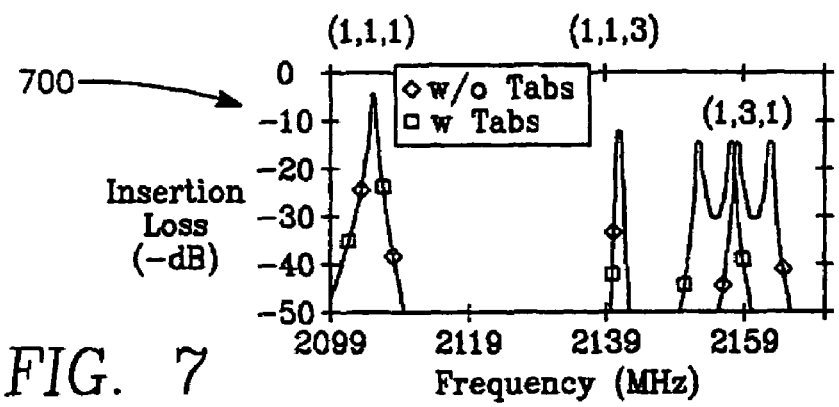
FIG. 7 is a plot of the spectral responses monolithic crystal filter of FIG. 6 with tabs and without tabs.

FIG. 6 is a top view showing a simplified illustration of electrodes 611 and 612 of monolithic crystal filters 605 and 615. FIG. 7 is a plot 700 of the spectral response of filter 605 (pair of acoustically coupled resonators) with electrode tabs 660t along with a plot of filter 615 (pair of acoustically coupled resonators) without tabs, shown in FIG. 6. In the embodiment of FIG. 6 the electrodes 612 are separated by 2 microns and are each 16 microns by 16 microns with tabs 660t that extend 2 microns from the periphery of the electrode 612 and are each 3.2 microns wide. The electrodes 611 are similarly sized and spaced, but without tabs Referring to FIGS. 5 and 7, in both plots 500 and 700, the desirable (1, 1, 1) mode remains essentially unperturbed. However, the anharmonic resonance frequencies of (1, 1, 3) and (1, 3, 1) modes, respectively, have been shifted downward significantly by the acoustically coupled resonators 405 and 605 with the tabs 460t and 660t, respectively. Thus, the shifted anharmonic frequencies can be filtered by cascading.

Figure 8:
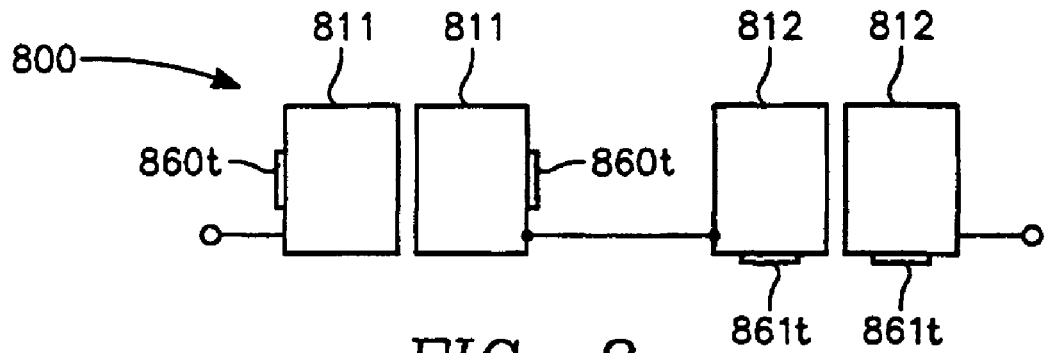
FIG. 8 is a top view of showing a simplified illustration of two cascaded monolithic crystal filters modified with the electrode tabs shown in FIGS. 4 and 6.
Figure 9:
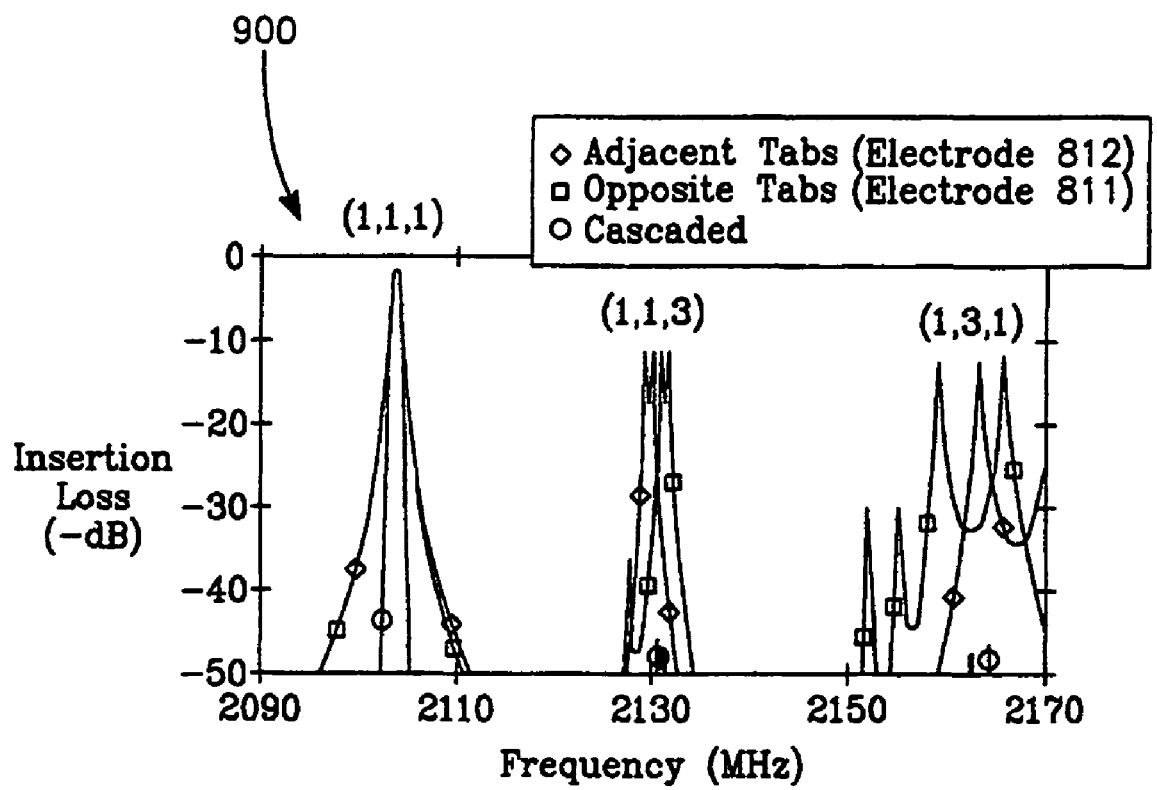
FIG. 9 is a plot of the spectral responses of the cascaded monolithic crystal filter of FIG. 8.

FIG. 8 is a top view of a simplified illustration of a 2 pole cascaded monolithic crystal filters embodiment 800. This example embodiment improved out-of-band rejection to greater than 45 db as shown in the spectral response plot 900 of FIG. 9. In the embodiment of FIG. 8, the electrodes 811 are separated by 1.5 microns and are each 15 microns by 19.2 microns, with tabs 860t that extend 1.5 microns from opposite 19.2 micron sides of the electrodes 811 and are each 4.8 microns wide. Similarly, the electrodes 812 are separated by 1.5 microns and are each 15 microns by 19.2 microns, but with tabs 861t that extend 1.2 microns from adjacent 15 micron sides of the electrodes 812 and are each 6 microns wide. In this embodiment, the tabs 860t are shown on opposite sides of the electrodes 811 and the tabs 861t are shown on adjacent sides of the electrodes 812.

Figure 10:
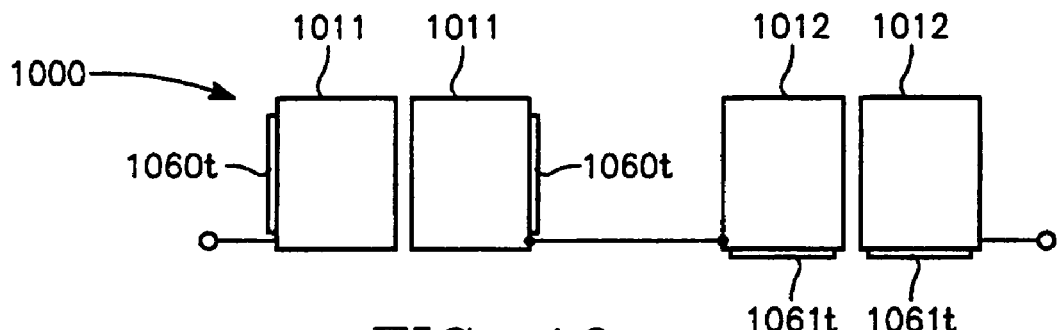
FIG. 10 is a top view of showing a simplified illustration of two cascaded monolithic crystal filters.
Figure 11:
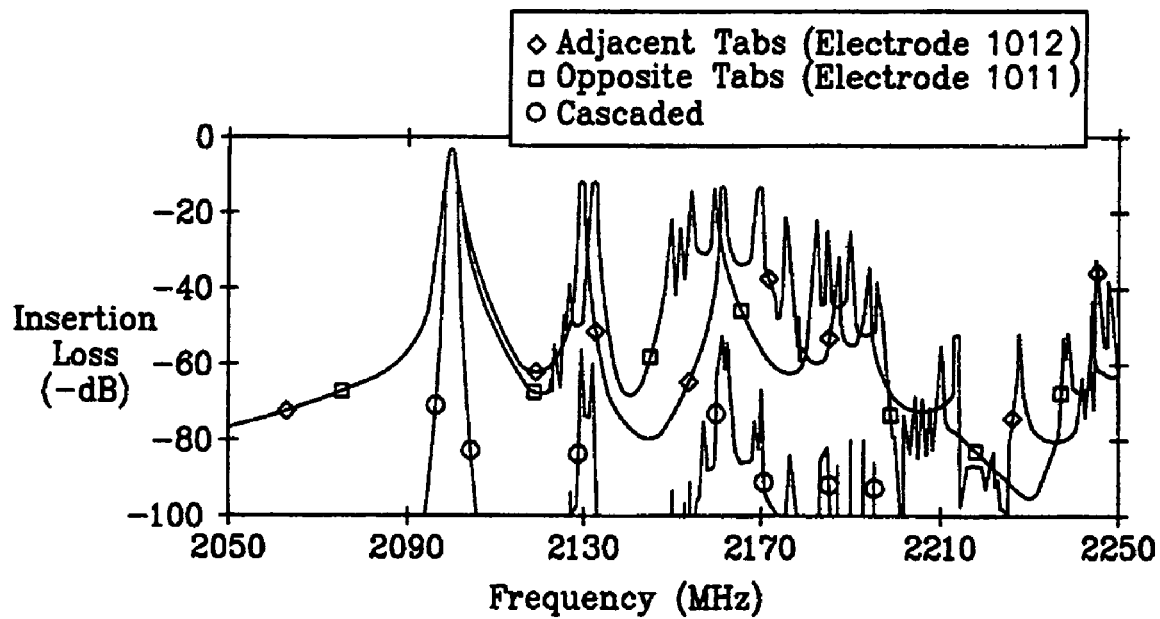
FIG. 11 is a plot of the spectral responses of the cascaded monolithic crystal filter of FIG. 10.

FIG. 10 shows another example embodiment of a cascaded monolithic crystal filter 1000. In this example, the out-of-band rejection was further improved to greater than 55 dB with less than 4 db insertion loss. In the embodiment of FIG. 10, the electrodes 1011 are separated by 1.5 microns and are each 15 microns by 15 microns, with tabs 1060t that extend 1.5 microns from opposite sides of the pair of electrodes 1011, and are each 9.6 microns wide. Similarly, the electrodes 1012 are separated by 1.5 microns and are each 15 microns by 19.2 microns, but with tabs 1061t that extend 1.2 microns from adjacent 15 micron sides of the electrodes 1012 and are each 6 microns wide. FIG. 11 shows the spectral plot 1100 for the example embodiment of FIG. 10.

In the cascaded monolithic crystal filter embodiments 800 (FIG. 8), for example, the cross sectional area of the tabs 860t and 861t have the same cross sectional area to ensure that the fundamental mode remains unchanged, while all of the anharmonic modes are shifted.

In various embodiments discussed above, monolithic crystal filters may be easily fabricated to provide a significant difference in anharmonic modes, while the center frequency remains essentially unchanged. Cascading two or more of these filters can provide a band-pass MCF with low insertion loss (a few dB or less) and extreme high out-of-band rejection (70-80 db or more).

Further, various embodiments may provide extremely low insertion loss for filters up to a few GHz regardless of extremely narrow (much less than 1% of the center frequency) or very wide (greater than 10%) bandwidth due to an extremely high Q. Moreover, a steep and high out-of-band attenuation is possible. In addition, some embodiments can provide minimum ripple in transmission band (much less than 1 dB).

In certain applications, embodiments can be used to provide a passive filter, with no other power consumption, other than insertion loss. Further, embodiments may be easily miniaturized if desired. Thus, embodiments may also have a great potential for wireless communication application into a small, low cost component.

Although above embodiments are shown with tabs, other embodiments may have cut-outs of the peripheral edge of the electrodes instead of, or in addition to tabs. Furthermore, although generally rectangular tabs and cut-outs are shown for illustration purposes, other shapes, configurations, or features are possible, such as for example, arcuate, circular, tapered, triangular, trapezoidal, etc., or other features at or near the periphery of the electrode. A "cut-out" is as used herein may be formed during deposition without having to remove material by cutting, etching, or other removal technique. Also, a tab may be formed from an electrode by cutting, trimming, etching, or other removal technique, or be added to an electrode after electrode formation.

In addition, although one tab or cut-out is shown on each electrode in FIGS. 4, 6, 8, and 10, it is possible that each electrode have more than one. For example, multiple tabs or cut-outs may be located on a same edge, or on opposing edges, of an electrode.

In alternate embodiments, a conventional monolithic crystal filter 100, shown in FIG. 1, may include tabs and/or cut-outs. This can reduce the anharmonic signal by 5 to 10 dB in some such embodiments. Although not required in all embodiments, typically, resonator electrode pairs, such as 112 and 113, will have the same feature at their peripheries. In one possible alternate embodiment, electrodes 112 and 113 may be configured as represented in FIG. 3B, and the electrodes 122 and 123 may be configured as represented in FIG. 3C. Or, in another alternate embodiment, electrodes 112 and 113 may be configured as shown in FIG. 3A, and electrodes 122 and 123 without any feature at the periphery.

The example embodiments herein are not intended to be limiting, various configurations and combinations of features are possible.

Having described this invention in connection with a number of embodiments, modification will now certainly suggest itself to those skilled in the art. As such, the invention is not limited to the disclosed embodiments, except as required by the appended claims.

What is claimed is:

1. A cascaded monolithic crystal filter comprising a pair of cascaded filters each comprising acoustically coupled resonators, wherein the pair of cascaded filters each comprise at least one resonator with at least one electrode having a periphery comprising a feature capable of shifting a frequency of an anharmonic mode without substantially shifting a frequency of a fundamental mode of the filter, and wherein the feature of each of the pair of filters is configured such that one of the pair of filters is capable of shifting a frequency of a different anharmonic mode than an other of the pair of cascaded filters.

2. The filter of claim 1, wherein the feature comprises at least one of: (a) a tab, or (b) a cut-out.

3. The filter of claim 1, wherein both electrodes of at least one of the resonators comprise the feature at a periphery.

4. A cascaded monolithic crystal filter comprising:
   a) a monolithic crystal;
   b) a first filter comprising:
      i) a first resonator comprising:
         (1) a pair of electrodes with the monolithic crystal therebetween; and
         (2) at least one of the pair of electrodes having a periphery comprising a feature capable of shifting a frequency associated with an anharmonic mode in the first filter; and
      ii) a second resonator acoustically coupled to the first resonator; and
   c) a second filter cascaded with the first filter, the second filter comprising:
      i) a third resonator comprising:
         (1) a pair of electrodes with the monolithic crystal therebetween; and
         (2) at least one of the pair of electrodes of the third resonator having a periphery comprising a feature capable of shifting a frequency associated with an anharmonic mode so as to cause separation between the anharmonic modes of the first filter and the second filter; and
      ii) a fourth resonator acoustically coupled to the third resonator.

5. The filter of claim 4, wherein the second resonator comprises an electrode having a periphery comprising a feature capable of shifting a frequency associated with an anharmonic mode in the first filter.

6. The filter of claim 5, wherein the fourth resonator comprises an electrode having a periphery comprising a feature capable of shifting a frequency associated with an anharmonic mode in the second filter.

7. The filter of claim 4, wherein the fourth resonator comprises an electrode having a periphery comprising a feature capable of shifting a frequency associated with an anharmonic mode in the second filter.

8. The filter of claim 4, wherein the feature of the first resonator and the feature of the third resonator comprise at least one of: (a) a tab, or (b) a cut-out.

9. The filter of claim 4, wherein both electrodes of the pair of electrodes of the first resonator comprise the feature at the periphery.

10. A cascaded monolithic crystal filter comprising:
    a) a monolithic crystal;
    b) a first filter comprising:
       i) a first resonator comprising:
          (1) a pair of electrodes with the monolithic crystal therebetween; and
          (2) at least one of the pair of electrodes having a periphery comprising a feature capable of shifting a frequency associated with an anharmonic mode in the first filter; and
       ii) a second resonator acoustically coupled to the first resonator;
    c) a second filter cascaded with the first filter, the second filter comprising:
       i) a third resonator comprising an electrode having a periphery comprising a feature capable of shifting a frequency associated with an anharmonic mode in the second filter; and
       ii) a fourth resonator acoustically coupled to the third resonator, wherein the fourth resonator comprises an electrode having a periphery comprising a feature capable of shifting a frequency associated with an anharmonic mode in the second filter; and
    d) wherein the feature of the first filter and at least one of: (1) the feature of the third resonator; or (2) the feature of the fourth resonator are configured such that the first filter is capable of shifting a frequency associated with a different anharmonic mode than the second filter.

11. The filter of claim 10, wherein the feature of the first resonator, the feature of the third resonator, and the feature of the fourth resonator comprises at least one of: (a) a tab, or (b) a cut-out.

12. A cascaded monolithic crystal filter comprising a pair of cascaded filters each comprising acoustically coupled resonators, each of the pair of cascaded filters each comprising at least one electrode having a periphery comprising a feature capable of shifting a frequency of an anharmonic mode without substantially shifting a frequency of a fundamental mode of the filter, and wherein the feature of each of the pair of cascaded filters causes separation between the anharmonic modes of each of the pair of filters so as to provide a band-pass monolithic crystal filter.

13. The filter of claim 12, wherein the feature comprises at least one of: (a) a tab, or (b) a cut-out.

14. A method for a monolithic crystal filter comprising:
    a) shifting an anharmonic mode frequency of a first filter by providing a feature at a periphery of at least one electrode of a first filter resonator;
    b) cascading the first filter with a second filter so as to filter an anharmonic mode frequency;
    c) shifting an anharmonic mode frequency in the second filter; and
    d) wherein shifting the anharmonic mode frequency of the second filter comprises shifting a different anharmonic mode frequency than the first filter.

15. The method of claim 14, wherein providing a feature comprises providing at least one of: (a) a tab; or (b) a cut-out.

16. The method of claim 14, wherein shifting an anharmonic mode frequency of the first filter comprises providing the feature at a periphery of both electrodes of the first filter resonator.

17. A method for a monolithic crystal filter comprising:
    a) shifting an anharmonic mode frequency of a first filter by providing a feature at a periphery of at least one electrode of a first filter resonator without substantially shifting a frequency of a fundamental mode of the first filter;
    b) shifting an anharmonic mode frequency in the second filter by providing a feature at a periphery of at least one electrode of a second filter resonator so as to cause frequency separation between the anharmonic modes of the first filter and the second filter without substantially shifting a frequency of a fundamental mode of the second filter; and c) cascading the first filter with a second filter so as to provide a band-pass monolithic crystal filter.

18. The method of claim 17, wherein providing a feature in the first filter and providing a feature in the second filter comprises providing at least one of: (a) a tab; or (b) a cut-out.

* * * * *